United States Patent [19]

Galvin et al.

[11] Patent Number: 4,757,030
[45] Date of Patent: Jul. 12, 1988

[54] METHOD OF MAKING GROUP IV SINGLE CRYSTAL LAYERS ON GROUP III-V SUBSTRATES USING SOLID PHASE EPITAXIAL GROWTH

[75] Inventors: Gregory J. Galvin, Ithaca, N.Y.; Christopher J. Palmstrom, Highland Park, N.J.

[73] Assignee: Cornell Research Foundation, Inc., Ithaca, N.Y.

[21] Appl. No.: 935,111

[22] Filed: Nov. 26, 1986

Related U.S. Application Data

[62] Division of Ser. No. 746,899, Jun. 20, 1985, abandoned.
[51] Int. Cl.[4] .................. H01L 21/203; H01L 21/365
[52] U.S. Cl. ..................... 437/132; 437/108; 437/82; 437/184; 437/973; 437/939; 437/946; 156/610; 156/612; 148/DIG. 17; 148/DIG. 71; 148/DIG. 59; 148/DIG. 154
[58] Field of Search ............. 29/576 E, 576 B, 576 T; 148/1.5, 175, 187, 174, DIG. 40, DIG. 83, 48, 71, 154; 156/603; 357/4, 16, 23.7, 61, 89; 427/53.1, 95

[56] References Cited

U.S. PATENT DOCUMENTS

| | | | |
|---|---|---|---|
| 2,878,152 | 3/1959 | Runyan et al. | 357/89 |
| 3,218,204 | 11/1965 | Ruehrwein | 357/16 |
| 3,392,056 | 7/1968 | Maskslick | 357/4 |
| 4,128,733 | 12/1978 | Fraas et al. | 148/175 |
| 4,171,235 | 10/1979 | Fraas et al. | 148/175 |
| 4,179,312 | 12/1979 | Keller et al. | 148/1.5 |
| 4,309,225 | 1/1982 | Fan et al. | 148/1.5 |
| 4,350,561 | 9/1982 | Little | 437/249 |
| 4,425,700 | 1/1984 | Sasaki et al. | 357/23.7 |
| 4,492,971 | 1/1985 | Bean et al. | 357/4 |
| 4,554,030 | 11/1985 | Haisma et al. | 148/175 |
| 4,556,895 | 12/1985 | Ohata | 357/16 |
| 4,559,091 | 12/1985 | Allen et al. | 148/174 |
| 4,561,916 | 12/1985 | Akiyama et al. | 148/175 |
| 4,579,609 | 4/1986 | Reif et al. | 437/39 |

OTHER PUBLICATIONS

Stall et al., J. Appl. Phys. 52(6), Jun. 1981, pp. 4062-4069.
Majni et al., *Elsevier Sequoia S.A.*, 193-199, (1977).
Marshal et al., *Elsevier Science Publishing Co., Inc.*, 25: 62-69, (1984).
Grimaldi et al., *J. Appl. Phys.*, 52(6): 4038-4046, (1981).
Grimaldi et al., *Appl. Phys. Lett.*, 39(1): 70-72 Jul. (1981).
Grimaldi et al., *J. Appl. Phys.*, 52(3): 1351-1355 Mar. (1981).
Williams et al., *Appl. Phys. Lett.*, 35(12): 994-996, Jun. (1980).
Csepregi et al., *Solid State Communications*, 21: 1019-1021, (1977).
Woodall et al., *J. Vac. Sci. Technol.*, 19(3): 794-798, Sep./Oct. (1981).
Grinolds et al., *Solid State Electronics*, 23: 973-985, (1980).
Sinha et al., *IEEE Transactions on Electron Devices*, 218-224, Ed.-22, No. 5, (1975).
Yeo et al., *J. Appl. Phys.*, 35(2): 197-199, Jul. (1979).
Anderson et al., *J. Appl. Phys.*, 49(5): 2998-3000, May (1978).
Tseng et al., *Appl. Phys. Lett.*, 36(6): 435-437 Mar. (1980).
Stall et al., *J. Appl. Phys.*, 52(6): 4062-4069, Jun. (1981).
Anderson et al., *IEEE Trans, Electron Dev. Meeting*, 192-194, (1977).
Stall et al., *Electronic Letters*, Oct. (1979).
Anderson et al., *IEEE Journal of Solid-State Circuits*, SC-13: 430-435, (1978).
Ballingall et al., *J. Appl. Phys.*, 52(6): 4090-4103, Jun. (1981).
Sarmal et al., *J. Appl. Phys.*, 56(10): 2703-2707, Nov. (1984).
Greene et al., *Elsevier Science Publishing Co., Inc.*, 701-707 (1982).

*Primary Examiner*—Brian E. Hearn
*Assistant Examiner*—William Bunch

[57] ABSTRACT

Solid phase epitaxial growth of single crystal layers on single crystal semiconductor substrates at temperatures low enough to preserve the integrity of other entities on the substrates. Contaminants are removed by low energy ion sputtering at a pressure low enough to delay their reformation before the layer can be deposited on the surface followed by annealing for one hour at 400° C. A method of solid phase epitaxially growing a single crystal layer on a single crystal semiconductor substrate is also disclosed.

8 Claims, 1 Drawing Sheet

METHOD OF MAKING GROUP IV SINGLE CRYSTAL LAYERS ON GROUP III-V SUBSTRATES USING SOLID PHASE EPITAXIAL GROWTH

This is a file wrapper continuation of application Ser. No. 746,899 filed June 20, 1985 now abandoned.

BACKGROUND OF THE INVENTION

The metallurgy of silicon devices is well established as evidenced by the large number of patents and the volume of papers concerning the detailed behavior of the metal-semiconductor interface. In contrast, methods of metallizing GaAs and other compound semiconductors are not well developed and the behavior of the interface is under current examination. Similarly, solid phase epitaxy (SPE) of silicon on silicon or silicides on silicon have been extensively studied, whereas SPE on compound semiconductors is still under investigation. Epitaxial growth by liquid and vapor phase techniques (high temperature) on compound semiconductors is a well established field relative to that which is known for SPE in these materials.

Problems with presently available ohmic contacts include island formation or balling-up at the surface and deep penetration or spiking of the metal into the GaAs substrate. Ohmic contacts to n-GaAs in current use involve a so-called alloying procedure which consists of melting a eutectic Au-Ge or Sn-based alloy film on the GaAs. The alloying cycle is critical in attempts to achieve low specific contact resistance. The cycle is sufficiently rapid that the equilibrium reactions are not reached and hence the contact is metastable, resulting in degradation upon further heating and use. Contacts of this type are susceptible to problems of reliability for the devices which have incorporated them. Methods which raise the temperature of the substrate can cause particle precipitation, increased spiking and increased contact degradation. For example, contacts to GaAs must withstand annealing temperatures up to 850° C. for post ion implantation heat treatment. However, GaAs exhibits signs of degradation at temperatures above 600° C. and the contact itself would degrade before the GaAs.

Ohmic contacts to n-GaAs using a Ge/GaAs heterojunction have been developed by using molecular beam epitaxy (MBE) with specific contact resistances below $10^{-7}$ $\Omega cm^2$, R. A. Stall et al, "A Study of Ge/GaAs Interfaces Grown by Molecular Beam Epitaxy", J. Appl. Phys. 52(6), June 1981, pp. 4062–4069. Au metallization can then be evaporated onto the heavily arsenic-doped Ge layers. The problem with MBE is that the substrate must be heated to high temperatures prior to growth of the Ge in order to properly clean and prepare the GaAs surface and is held at elevated temperatures during the Ge growth. This makes the technique unsuitable for producing electrical contacts on GaAs which will require lithographic processing. A wafer of GaAs with property modifying and device creating entities such as diffusions, implants, pattern, other metal layers, and photoresists cannot be subjected to MBE without changing or destroying the previous steps.

Epitaxial growth of Ge on GaAs has been obtained by raising the temperature to high enough values to result in liquid phase growth. Ge which has been rendered amorphous by implantation can be raised to a temperature of approximately 375° C., at which point the amorphous Ge will regrow epitaxially in the solid phase. SPE enables greater control of the geometry and the location of the epitaxial layers which is often difficult with liquid or vapor phase technologies, S. S. Lau and W. F. Van der Weg, "Thin Films—Interdiffusion and Reactions", edited by J. M. Poate, K. N. Tu, J. W. Mayer (Wiley: N.Y., 1978) Chapter 12. Until the present invention, it has not been possible to cause a deposited layer of Ge on an unheated GaAs surface to grow epitaxially at low temperatures.

Specific contact resistance of $3 \times 10^{-5}$ $\Omega cm^2$ has been reported with Ni layered over Ge deposition on a GaAs substrate. W. T. Anderson et al, "Smooth and Continuous Ohmic Contacts to GaAs Using Epitaxial Ge Films", J. Appl. Phys. 49(5), May 1978, pp. 2998–3000. The GaAs substrate is heated to 575° C. for 15 min under a pressure of $2 \times 10^{-7}$ torr to desorb the surface oxides just prior to deposition of the Ge layer. A reduction of surface oxygen content of 2.5 times was shown. The Ge deposition of 100 nm on a heated GaAs substrate was iollowed by a 100 nm Ni overlay. Then the combination was sintered at 450° to 550° C. for times from 1 to 45 min.

Specific contact resistance of $2 \times 10^{-4}$ $\Omega cm^2$ was reported by Lau at the University of California at San Diego. E. D. Marshall et al, "Pt and Pd Silicides and Pd Germanide as Contact Metallizations for GaAs", Mat. Res. Soc. Symp. Proc. Vol 25 (1984), pp. 63–68. To avoid the interfacial oxide problem a Pd layer is deposited between the Ge and the GaAs. The Pd layer is believed to react with the interfacial oxide and some of the Ge to form PdGe. The excess Ge is free to diffuse through the PdGe and grow by solid phase epitaxy on the GaAs. The resulting epitaxy using this technique is of poor quality.

Nothing in the prior art teaches solid phase epitaxial growth of deposited Ge layers on a GaAs substrate directly at temperatures low enough to preserve the integrity of prior steps, which is disclosed in the present invention.

SUMMARY OF THE INVENTION

The present invention is directed to the solid phase epitaxial growth of a single crystal layer on single crystal semiconductor substrates at temperatures low enough so that other structures such as property modifying and device creating entities on the substrate are unaffected, for example, entities sensitive to temperatures above approximately 400° C. The single crystal layer may be a semiconductor, a metal, a semiconductor-metal alloy or an insulator. The substrate may be germanium, a group III-V semiconductor or a group II-VI semiconductor.

An embodiment of the invention is the creation of a stable, ohmic contact having a low specific contact resistance. Another embodiment is the growth of such an ohmic contact on a hybrid circuit. An additional embodiment is the creation of an ohmic contact on an optoelectronic hybrid device. The present invention can be practiced to create a stable ohmic contact on an AlGaAs hybrid circuit.

The present invention, therefore, provides a method of producing solid phase epitaxial growth of Ge on a GaAs structure, or of Ge on a Ge structure, or of a number of conductor, semiconductor or insulator epitaxial layers on a semiconductor structure, where the structure may have undergone prior steps to produce specific changes in defined locations, which method is compatible with present industry standards of integrated circuit fabrication. For example, the prior steps can include lithography, patterning techniques, and implantation of dopants. These entities experience degradation at high temperature. For example, temperatures exceeding 500° C. are common in the use of molecular beam epitaxial methods.

Briefly, the present invention is directed to Ge on a single crystal of GaAs, wherein the Ge is epitaxially grown on the GaAs. The GaAs surface is cleaned by low energy ion sputtering, with the device under a pressure low enough to delay the reformation of interfacial contaminants. For example, a pressure less than $10^{-8}$ torr. The sputter cleaning may be 3 keV Ar+ for approximately five minutes. The Ge layer is deposited on the cleaned GaAs surface before the contaminants can become reestablished. The time in which the contaminants reform varies with the pressure. Following the deposition of the amorphous Ge layer, the structure is annealed. For example, it can be annealed at 400° C. for one hour. During the annealing the Ge grows epitaxially on the GaAs.

The foregoing and additional features and advantages of the present invention will become apparent to those skilled in the art from a consideration of the drawings, from the detailed description and from the preferred embodiment which is disclosed hereinafter.

DESCRIPTION OF THE PREFERRED EMBODIMENT

Extensive experiments have shown that surface contaminants are more serious than previously thought. Oxides of several monolayers, perhaps even a monolayer, will inhibit solid phase epitaxy (SPE), due to the very low forces promoting SPE of single crystal layers on single crystal semiconductor substrates. High temperatures (greater than 500° C.) can be used to partially overcome contaminant effects. And very high temperature such that the liquid state is reached may eliminate surface contaminant effects altogether.

The crystal lattice structure of Ge is approximately an 0.19% mismatch to the lattice of GaAs. Due to this small mismatch SPE can be produced if the surface is free of contaminants. At a pressure of $10^{-7}$ torr a monolayer of oxide contaminants reforms in approximately 10 sec. At pressures of $10^{-6}$ torr and above there is no chance for SPE since the contaminants reform at essentially the same time as the surface is cleaned, rendering the cleaning futile no matter what method is employed.

When a pressure of $10^{-9}$ torr is maintained, the rate of oxide reformation is on the order of $10^{-3}$ monolayers/sec. With an oxide buildup at this rate there is time to deposit a layer of Ge before the cleaned GaAs surface or the Ge surface becomes contaminated. The structure can be transported to a vacuum annealing furnace where SPE growth can take place at temperatures equal to or below 400° C.

Figure 1:
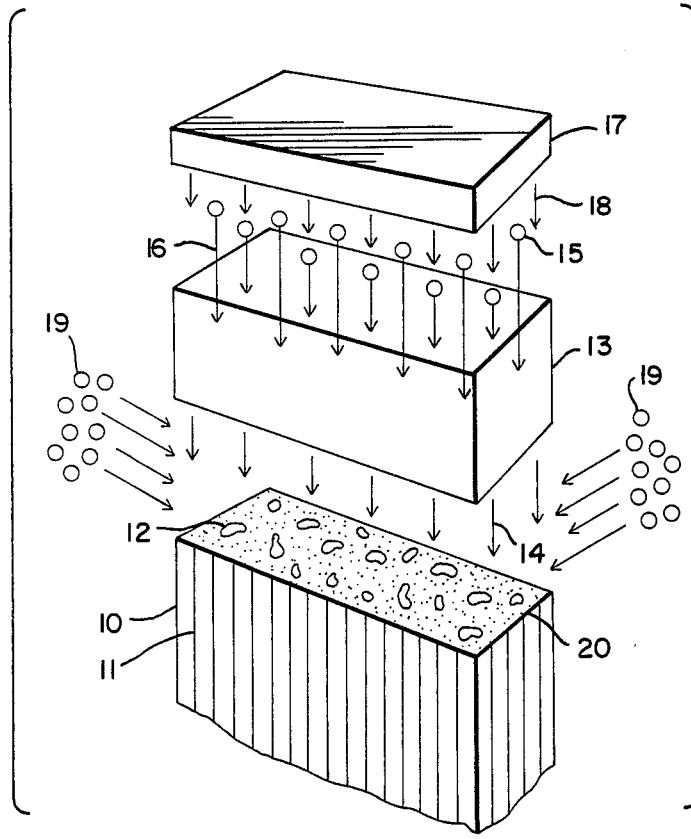
FIG. 1 is an exploded schematic view of the structure which shows the single crystal GaAs and contaminants on its top surface. The Ge layer is shown a short distance above the surface and ion beams are shown directed to the space between this layer and the contaminants on the surface. A metal cap is shown a short distance above the Ge layer.
Figure 5:
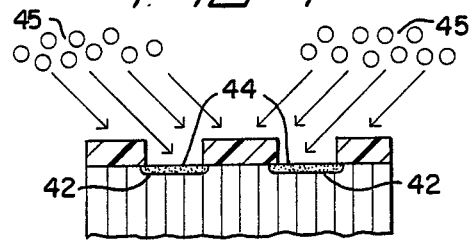

Turning now to the drawings, FIG. 1 at 10 shows a single crystal of GaAs with multiple vertical lines 11 indicating a crystal axis. Oxide and hydrocarbon contaminants 12 are shown on the top surface 20 of the GaAs crystal 10. A layer of Ge 13 is shown directly above the crystal 10 and is deposited by electron beam, suggested by the deposition lines 14. Dopant 15 is introduced into the Ge layer 13 by ion implantation, as suggested by the vertical lines 16. A metal cap layer 17 is deposited on the Ge layer 13 by electron beam. This deposition is suggested by the vertical lines 18. Also shown in FIG. 1 are the argon ions 19 directed at the top surface 20 of the GaAs crystal 10 where the contaminants 12 are located. This is the cleaning process by ion beam sputtering.

Figure 2:
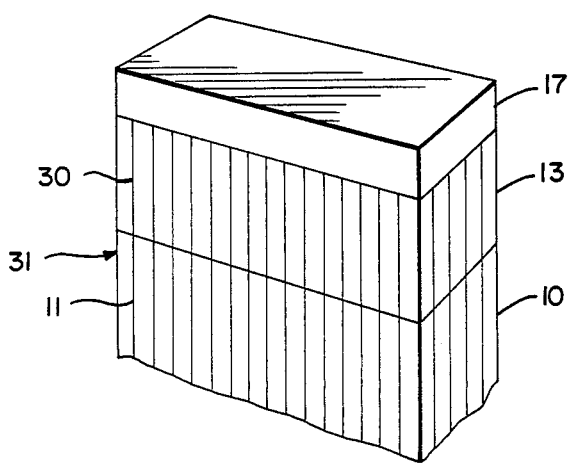
FIG. 2 is a schematic drawing of the structure with the GaAs crystal, the Ge layer and the metal layer in close contact with one another. The multiple vertical lines in the figure indicate crystal match or epitaxy of the Ge layer on the GaAs.

The schematic drawing of FIG. 2 shows the structure 31 in a completed state wherein the GaAs crystal 10, the Ge layer 13 and the metal cap 17 are joined. As in FIG. 1 the vertical lines 11 in the GaAs indicate the crystal axis. The Ge layer 13 contains vertical lines 30 which indicate a crystal axis that is in line with the crystal axis of the GaAs 10, shown by the lines 30 and the lines 11 in parallel. This is the epitaxial growth of the Ge 13 on the GaAs 10. Therefore, FIG. 2 shows the three parts joined, but more than that, the Ge and GaAs are epitaxially joined.

Figure 3:
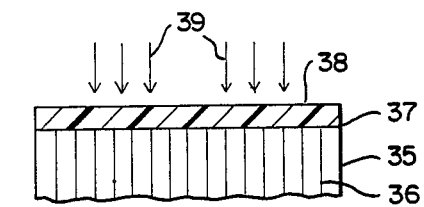
FIGS. 3 through 8 show the steps in the preparation of a MOSFET style source/drain, including exposing the resist, dopant implantation and lift-off of metallization by dissolving the resist. This is one of a number of ways in which the invention may be practiced.
Figure 4:
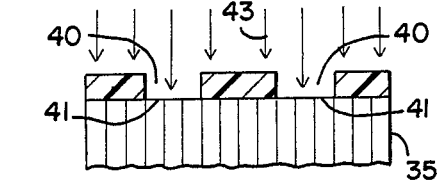
Figure 6:
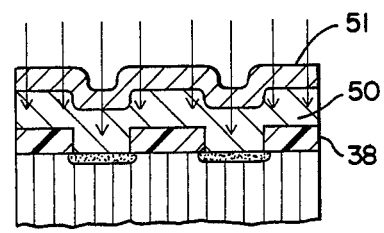
Figure 7:
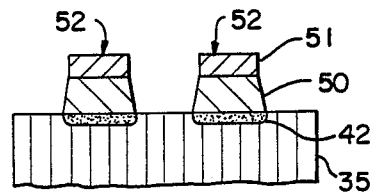
Figure 8:
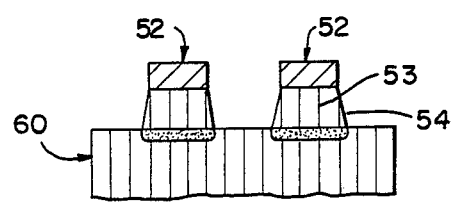

FIGS. 3 through 8 illustrate one of the applications of the invention, the metallization of a MOSFET style source/drain, 60 in FIG. 8. In FIG. 3 a single crystal 35 has vertical lines 36 to illustrate the crystal axis. The top surface 37 has an overlay of resist 38. A pattern is exposed in the resist indicated by the arrows 39. Thereafter the resist is developed leaving the openings 40 in FIG. 4 such that the surfaces 41 of the single crystal 35 are exposed. Arrows 43 in FIG. 4 indicate implantation of dopants. Contaminants (not shown) similar to those at 12 in FIG. 1 will form on surfaces 41. The dopant implantation, followed by activation, creates doped semiconductor regions 42 in FIG. 5. The surfaces 44 of the doped semiconductor are cleaned by ion sputtering illustrated at 45. In FIG. 6 a layer of Ge 50 is deposited on the cleaned surface followed by a metal cap layer 51. The Ge layer is deposited after the ion beam sputter cleaning and before the contaminants can reform. Resist 38 in FIG. 6 is dissolved resulting in lift-off of the deposited layers 50 and 51 such that in FIG. 7 the contact points, shown generally by the numeral 52, remain at those positions on the single crystal substrate 35 where resist had been omitted. The Ge 50 in FIG. 7 is shown free of vertical lines. At this point in the process the device is heated to a temperature at which solid phase epitaxy takes place, illustrated by the vertical lines 53 in the Ge 54 in FIG. 8. In FIG. 8 at 60 is generally shown the completed MOSFET style source/drain.

The following steps illustrate the best mode of practicing the invention. Semi-insulating (100) GaAs substrates were degreased, etched in $NH_4OH:H_2O_2:H_2O$ (1:1:40 by volume), and rinsed in $NH_4OH:H_2O$ (1:10 by volume) prior to loading into the deposition system. The deposition system is equipped for Auger analysis (PHI 10-155), argon ion sputtering (PHI differentially pumped gun incident at 20° to the sample surface) and electron beam evaporation. The GaAs surface was sputter cleaned with 3 keV Ar+ until Auger spectroscopy could no longer detect carbon or oxygen (approximately 5 minutes of sputtering at ~4 μA). A very small Ar signal was observed in Auger analysis of the GaAs after sputter cleaning. The base pressure of the evaporation system was $2 \times 10^{-9}$ torr. Approximately 100 nm of Ge was deposited on the clean GaAs at a pressure of $6 \times 10^{-8}$ torr. The sample was removed from the evaporation system and annealed in a turbomolecular pumped vacuum furnace ($<5 \times 10^{-7}$ torr) at 400° C. for one hour. Helium ion channeling (2 MeV He++) was used to observe the epitaxial crystallization of the Ge layer. Ion implantation of Si+ and As+ was performed with a 300 keV implanter in a liquid nitrogen trapped diffusion pumped chamber prior to solid phase epitaxial growth of the Ge. The pressure during implantation was typically $2 \times 10^{-7}$ torr A thin (~25 nm) capping layer of either Si or V was deposited to prevent contamination of the Ge during implantation.

Samples of Ge deposited on chemically cleaned GaAs (no sputtering and no implantation) were annealed at temperatures up to 600° C. with essentially no evidence of epitaxy. If the lack of epitaxy was due to interfacial oxides, then ion beam mixing of the interface should break up the oxide layer and potentially enhance the epitaxy. Implantation will create a damaged layer in the GaAs substrate. The thickness of this layer must be kept to a minimum such that the layer can be regrown by solid phase epitaxy, typically no more than 40 nm for GaAs. Hence, the ion energy was chosen such that the projected range $R_p$ plus the straggling $\Delta R_p$ for the ion was approximately equal to the thickness of the deposited layers (V cap plus Ge). The substrates were heated (250° C.) during implantation to enhance the mixing and promote radiation enhanced regrowth of the GaAs. After annealing the implanted samples at 400° C. for one hour there was no evidence of epitaxy. However, after further annealing at 600° C. for one hour, some alignment of the Ge to the GaAs substrate was observed ($\chi_{min} \sim 60\%$). Annealing at 650° C. did not significantly improve the epitaxy. Room temperature and liquid nitrogen temperature implants produced even less epitaxy. A parallel experiment was performed using Ge deposited on Ge substrates instead of GaAs. Partial solid phase epitaxy was observed for Ge on Ge after 400° C. annealing of implanted samples.

In previous reports of Ge epitaxy on Ge (unimplanted), interfacial oxides were claimed to be responsible for the high temperatures (750° C.) needed to obtain epitaxy. The observation of epitaxy at much lower temperatures in the ion beam mixed samples is further indication of the role of interfacial oxides.

The existence of interfacial contamination (C. and 0) was verified by Auger spectroscopy. The oxygen is most likely present as thin (~1 nm) gallium and arsenic oxides. Argon ion sputter cleaning in the deposition system immediately prior to Ge evaporation produced a GaAs surface with contamination levels at approximately the detectability limit of the Auger spectrometer. Complete solid phase epitaxy after annealing at 400° C. for one hour was observed on the sputter cleaned samples.

Ion studies showed that the $\chi_{min}$ for the epitaxial Ge layer is ~9.6%. The actual crystalline quality of the Ge is better than that indicated by $\chi_{min}$ as the thin V layer introduces dechanneling which will raise the measured $\chi_{min}$ slightly. GaAs recrystallizes epitaxially at temperatures of <250° C., hence, any damage introduced in the GaAs substrate by the sputter cleaning process should anneal out prior to the epitaxial growth of the Ge. The degree of epitaxy obtained during thermal annealing is determined by the amount of contamination present on the GaAs surface prior to deposition of the Ge layer. Ion beam mixing can be used to disrupt the interfacial oxides and enhance the epitaxy. However, complete epitaxy at low annealing temperatures was only obtained for contamination free GaAs surfaces. The sensitivity to surface contamination implies that the potential role of impurities in solid phase reactions in general cannot be overlooked.

The above detailed description of the invention sets forth the best mode as required by the United States patent statutes. The invention has been disclosed by way of illustration and not of limitation. Accordingly, all modifications, alterations, changes and the like, which fall within the spirit and scope of the invention as set forth in the appended claims are included herein.

We claim:

1. A method of solid phase epitaxially growing a Ge layer on a group III-V substrate comprising the steps of:
   cleaning a surface of the substrate without heating for a time sufficient to remove contaminants from the surface at a pressure low enough to delay contaminant reformation.
   depositing a Ge layer on the cleaned substrate surface without heating the substrate after said cleaning within a time period before substantial contaminant reformation occurs,
   implanting ions selected from the group consisting of Si+ and As+ into said deposited Ge layer,
   thereafter annealing combined structure of the ion implanted Ge layer and the substrate by heating in an annealing furnace to allow the Ge to grow on the substrate by solid phase epitaxy.

2. The method of claim 1 wherein the cleaning is by ion beam sputtering.

3. The method of claim 2 wherein the ion beam is argon.

4. The method of claim 1 wherein the substrate is GaAs.

5. The method of claim 1 wherein the pressure is less than $10^{-8}$ torr.

6. The method of claim 1 wherein the annealing is at a temperature less than 400° C.

7. The method of claim 1 wherein the annealing time is less than one hour.

8. The method of claim 2 wherein said substrate contains an entity selected from the group consisting of diffusions, implants, pattern layers, other metal layers and photoresists which cannot be subjected to temperatures above about 400° C. without changing or destroying said entity wherein said annealing is carried out at a temperature less than 400° C. so as not to change or destroy said entity.

* * * * *